(12) United States Patent
Kenkare (10) Patent No.: US 7,864,617 B2
(45) Date of Patent: Jan. 4, 2011

(54) MEMORY WITH REDUCED POWER SUPPLY VOLTAGE FOR A WRITE OPERATION

(75) Inventor: Prashant Kenkare, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 143 days.

(21) Appl. No.: 12/388,911

(22) Filed: Feb. 19, 2009

(65) Prior Publication Data
US 2010/0208529 A1 Aug. 19, 2010

(51) Int. Cl.
*G11C 5/14* (2006.01)
(52) U.S. Cl. ............. 365/226; 365/189.08; 365/189.09; 365/189.16
(58) Field of Classification Search ............ 365/189.09, 365/226, 189.08, 189.16, 189.11, 154
See application file for complete search history.

(56) References Cited

U.S. PATENT DOCUMENTS

| 5,298,816 | A | 3/1994 | Kaplinsky |
| 6,791,864 | B2 | 9/2004 | Houston |
| 7,079,426 | B2 | 7/2006 | Zhang et al. |
| 7,085,175 | B2 * | 8/2006 | Remington et al. .... 365/189.09 |
| 7,292,495 | B1 | 11/2007 | Kenkare et al. |
| 7,443,374 | B2 | 10/2008 | Hudson |
| 7,502,275 | B2 * | 3/2009 | Nii et al. ..................... 365/226 |
| 2006/0186935 | A1 | 8/2006 | Hwang et al. |
| 2006/0262628 | A1 | 11/2006 | Nii et al. |
| 2008/0158939 | A1 | 7/2008 | Chen et al. |

OTHER PUBLICATIONS

Non-Published U.S. Appl. No. 11/847,424, filed with the US Patent Office on Aug. 30, 2007, first named inventor Matthew S. Berens.
Office Action mailed Apr. 2, 2010 in U.S. Appl. No. 12/275,622.
Notice of Allowance mailed Jun. 2, 2010 in U.S. Appl. No. 12/275,622.

* cited by examiner

*Primary Examiner*—Anh Phung
*Assistant Examiner*—Hien N Nguyen
(74) *Attorney, Agent, or Firm*—James L. Clingan, Jr.; Daniel D. Hill (57) ABSTRACT

A memory includes a selection circuit and a write assist circuit. The selection circuit has a first input, a second input coupled to a first power supply voltage terminal, an output coupled to a power supply terminal of each of a plurality of memory cells, and a control input for receiving a write assist control signal. The write assist circuit is coupled to the first input of the selection circuit for reducing a voltage at the power supply terminal of each of the plurality of memory cells during a write operation and in response to an asserted write assist enable signal. The write assist circuit comprises a P-channel transistor and a bias voltage generator. The P-channel transistor is for reducing the voltage at the power supply terminal of each of the plurality of memory cells during the write operation. The bias voltage generator is for providing a variable bias voltage to the P-channel transistor.

20 Claims, 4 Drawing Sheets

MEMORY WITH REDUCED POWER SUPPLY VOLTAGE FOR A WRITE OPERATION

RELATED APPLICATIONS

This application is related to U.S. application Ser. No. 12/275,622, titled "Integrated Circuit Having Memory With Configurable Read/Write Operations And Method Therefor," by Andrew C. Russell and Shayan Zhang, filed Nov. 21, 2008, and assigned to the assignee hereof.

BACKGROUND

1. Field

This disclosure relates generally to memories, and more specifically, to memories that may benefit from a reduced bitcell power supply voltage during a write operation.

2. Related Art

Some memories, especially static random access memories (SRAMs), may benefit from reducing the bitcell power supply voltage during a write operation. An SRAM cell may have one logic state, due to an imbalance among the transistors in the cell that is particularly difficult to write at the normal bitcell power supply voltage. One of the techniques used to overcome this problem has been to reduce the bitcell power supply during a write operation. Reducing the bitcell power supply voltage at first may appear to provide a power reduction, but the power supply voltage, after the write operation, is restored to the original value for reading. The process of restoring the original voltage requires significant power. Thus, the affect of lowering the bitcell power supply voltage actually results in an increase in power consumption due to the subsequent recharging of the array when the power supply voltage is restored to the original value. Thus, although beneficial for writing, the bitcell power supply reduction approach does have a disadvantage.

Accordingly, there is a continuing need for providing improved techniques relating to reducing the bitcell power supply voltage during the write operation of a memory.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a memory that may benefit from a reduced voltage for a write operation can choose a different voltage for writing different portions of the memory. The reduced power supply voltage used for the memory cells being written can be selected based upon the actual need. For convenience the reduced voltage can be selected on a memory block basis. In such cases, each memory block may have a different voltage level from the other memory blocks for write operations. Additionally, the particular reduced voltage may only be applied to those columns within the memory block that need the reduced voltage. This may be better understood by reference to the drawings and the following description.

Figure 1:
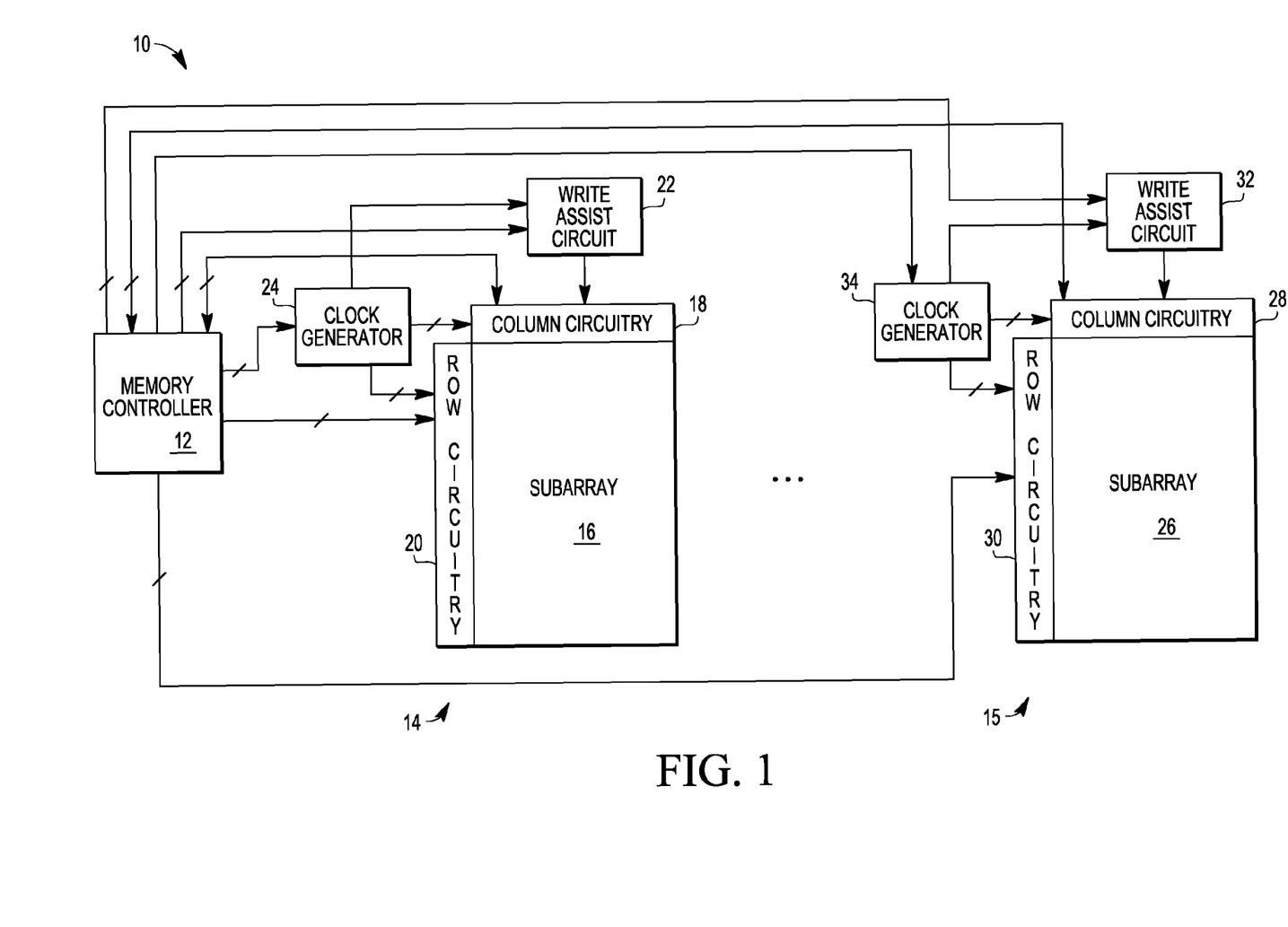
FIG. 1 is a block diagram of a system having a plurality of memory blocks according to an embodiment.

Shown in FIG. 1 is a system 10 comprising a memory controller 12, a memory block 14 and a memory block 15. Memory block 14 comprises a subarray 16, column circuitry 18 coupled to subarray 16, row circuitry 20 coupled to subarray 16, a write assist circuit 22, and a clock generator 24. Memory block 15 comprises a subarray 26, column circuitry 28 coupled to subarray 26, row circuitry 30 coupled to subarray 26, a write assist circuit 32, and a clock generator 34. Column circuitry 18 is further coupled to memory controller 12, write assist circuit 22, and clock generator 24. Row circuitry 20 is further coupled to memory controller 12 and clock generator 24. Clock generator 24 is further coupled to memory controller 12. Column circuitry 28 is further coupled to memory controller 12, write assist circuit 32, and clock generator 34. Row circuitry 30 is further coupled to memory controller 12 and clock generator 34. Clock generator 34 is further coupled to memory controller 12.

In operation, memory system 10 accesses one or more memory blocks for a read or a write operation. In the case of a read operation, data may be obtained from one memory block or more than one memory block in conventional fashion. Using memory block 14 as an example, row circuitry 20 receives a row address from memory controller 12, column circuitry 18 receives a column address, and clock generator 24 provides clock signals to row circuitry 20 and column circuitry 18. As timed by clock signals from clock generator 24, row circuitry 20 enables a selected word line and column circuitry 18 reads data on one or more selected columns. Similarly for a write operation, data may be written to one memory block or more than one memory block. Continuing using memory block 14 as the example, row circuitry 20 receives a row address from memory controller 12, column circuitry 18 receives a column address, and clock generator 24 provides clock signals to row circutry 20, column circuitry 18, and write assist circuit 22. As timed by clock signals from clock generator 24, row circuitry 20 enables a selected word line and column circuitry writes data on one or more selected columns. In the case of writing, write assist circuit 22, as enabled by memory controller 12 and clock generator 24, may provide a reduced power supply voltage to power the memory cells of a selected column during the write operation. This reduced power supply voltage, if any, is chosen based upon the requirements of the memory cells of subarray 16. Memory block 15 operates the same way in response to memory controller 12 except that the reduced power supply voltages selected for a write operation is based upon the requirements of the memory cells of subarray 26. Thus the reduced power supply voltage during a write operation for memory block 14 may be different than the reduced power supply voltage during a write operation for memory block 15. Additionally, columns that do not have memory cells that need the reduced power supply voltage may be powered at the normal power supply voltage during a write. In the case of multiple columns being accessed during a single write, it may be preferable for simplicity to apply the reduced voltage to all of the selected columns even if only one of the columns needs the reduced voltage. There may be applications where it is beneficial to lower the bitcell power supply voltage only for those columns that contain one or more bitcells with marginal writeability.

The columns that need the reduced power supply voltage during a write are identified during testing. Using memory block 14 as the example, at first the memory cells are tested at the normal supply voltage. If all of the memory cells can be written with the requisite margin, then there is no reduction in the power supply voltage during write operations. On the other hand, if a memory cell is found to not pass the write requirements at the normal power supply voltage, it is tested at lower bitcell power supply voltages until a bitcell power supply voltage is found that is sufficiently low for it to pass. Such a cell is considered to have marginal writeability. For current SRAM designs, all of the memory cells in a column are connected to the same power supply line. In such a case there is a lower limit, based upon data retention, as to how far the power supply voltage can be reduced. Thus a memory cell that can only be reliably written at a voltage that is reduced below that necessary to retain data in the non-selected cells in the column is considered a failed cell. There may be SRAM architectures where that may not be the case though. If it does occur, the column or row that has the failed cell will be need to be replaced by redundancy or otherwise taken into account. Of course there may be more than one column having cells with marginal writeability. In such case and in this example, there will be only one reduced voltage per memory block so the cell that needs the lowest voltage in a memory block will be the cell that determines the value of the reduced voltage. Also in the current example, for simplicity it has been found beneficial that all of the memory cells of a memory block have the same power supply. Thus, for a write operation all of the memory cells receive the same reduced power supply voltage.

Figure 2:
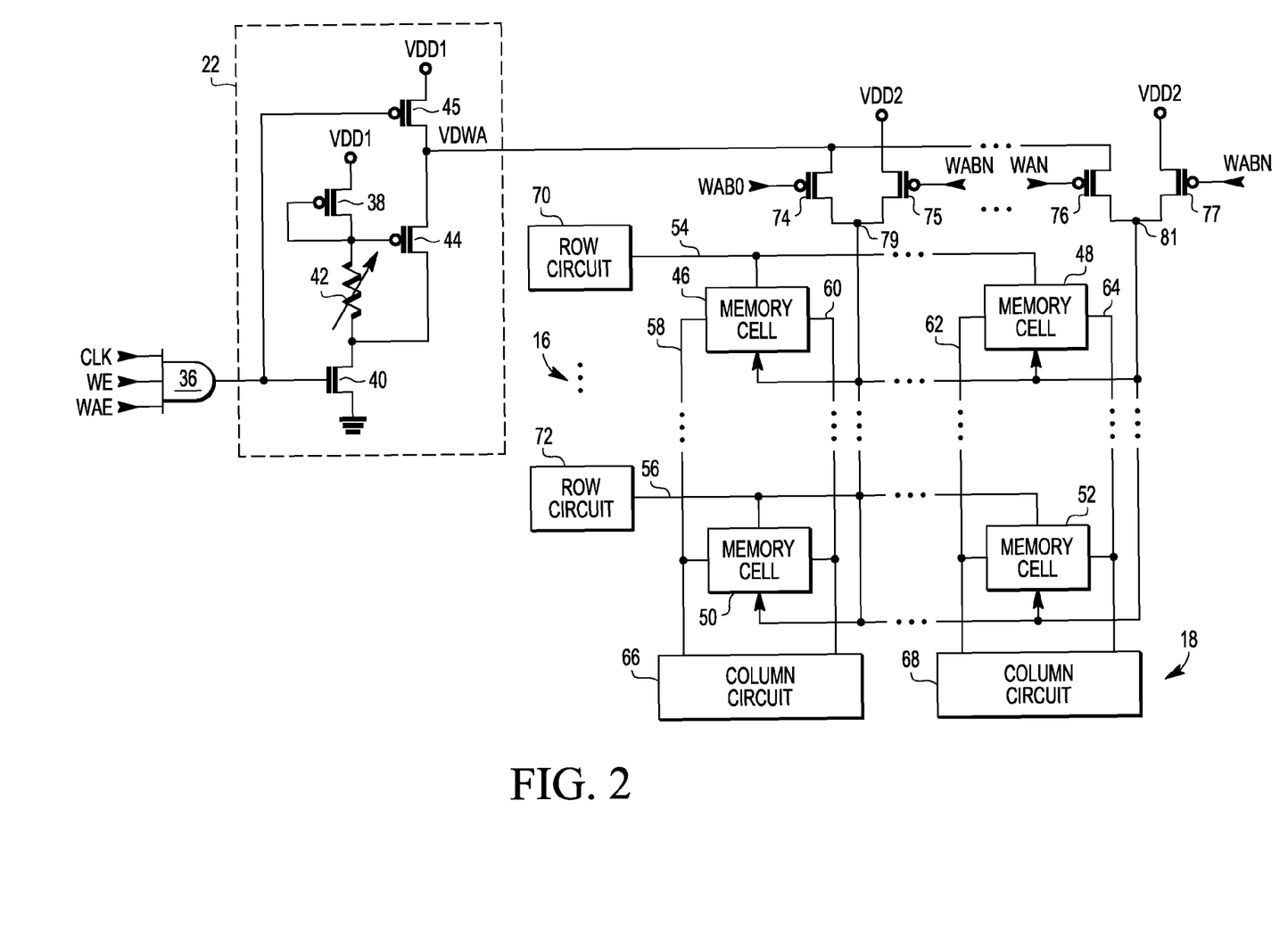
FIG. 2 is a combination circuit, block, and logic diagram showing more details of a memory block of the plurality of memory blocks of FIG. 1.

Shown in FIG. 2 is write assist circuit 22, an AND gate 36 that is a portion of clock generator 24, subarray 16, row circuitry 20, and column circuitry 18. Subarray 16, as shown in FIG. 2, comprises a memory cell 46 coupled to a word line 54, a memory cell 48 coupled to word line 54, a memory cell 50 coupled to a word line 56, a memory cell 52 coupled to word line 56, a P channel transistor 74, a P channel transistor 75, a P channel transistor 76, and a P channel transistor 77. Transistors 74 and 75 have drains connected together that forms a bitcell power supply terminal 79. Transistors 76 and 77 have drains connected together that form a bitcell power supply terminal 81. Memory cells 46 and 50 are coupled to bit lines 58 and 60. Memory cells 48 and 52 are coupled to bit lines 62 and 64. Memory cells 46 and 50 are coupled to bitcell power supply terminal 79. Memory cells 48 and 52 are coupled to bitcell power supply terminal 81. As is well understood by one of ordinary skill in the art, subarray 16 would typically contain many more memory cells than the four shown as well as many more word lines and bit lines. Row circuitry 20 as shown in FIG. 2 comprises a row circuit 70 coupled to word line 54 and row circuit 72 coupled to word line 56. Column circuitry 18 comprises column circuit 66 coupled to bit lines 58 and 60 and column circuit 68 coupled to bit lines 62 and 64. AND gate 36 has a first input for receiving a clock signal CLK which is generated within generator 24, a second input for receiving a write enable signal WE generated within clock generator 24, and a third input for receiving a write assist enable signal WAE generated within clock generator 24. Write assist circuit 22 has an N channel transistor 40, a trimmable resistor 42, a P channel transistor 38, a P channel transistor 44, and a P channel transistor 45. Transistor 40 has a gate coupled to an output of AND gate 36, a source coupled to ground, and a drain. Trimmable resistor 42 has a first terminal coupled to the drain of transistor 40 and a second terminal. Transistor 38 has a gate and drain connected to the second terminal of trimmable resistor 42, and a source coupled to a positive power supply terminal VDD1. Transistor 44 has a drain connected to the drain of transistor 40, a gate connected to the drain and gate of transistor 38, and source. Transistor 45 has a source connected to power supply terminal VDD1, a gate connected to the output of AND gate 36, and a drain connected to the source of transistor 44. The connection of the drain of transistor 45 and the source of transistor 44 forms a node used in supplying the reduced power supply voltage that may be called the write assist power supply terminal VDWA. Transistor 74 has a source coupled to terminal VDWA and a gate for receiving a write assist bar signal WAB0. Transistor 75 has a source connected to a positive power supply terminal VDD2 and a gate for receiving a write assist signal WA0. Transistor 76 has a source coupled to terminal VDWA and a gate for receiving a write assist bar signal WAN. Transistor 77 has a source connected to a positive power supply terminal VDD2 and a gate for receiving a write assist signal WABN. Write assist and write assist bar signals WA0, WAB0, WAN, and WABN are provided by column circuitry 18. In this example, VDD1 is considered the base power supply voltage and VDD2 may be elevated above that for enhancing read operations although VDD1 and VDD2 may also be at the same level.

When write assist signal WA0 is asserted, which means when it is a logic high, transistor 75 is non-conductive and transistor 74 is conductive. This is the case when a reduced bitcell power supply voltage is applied for the write operations on subarray 16. In this case transistor 74 couples write assist power supply terminal VDWA as the power supply to memory cells 46 and 50. The voltage at terminal VDWA is determined by trimmable resistor 42. For the case of a write with a reduced bitcell power supply voltage, which is the case where write assist signal WA0 is asserted, write enable is asserted and write assist enable is asserted. Write assist enable asserted indicates that write operations are with the reduced voltage. Thus, when clock signal CLK is enabled, transistor 40 becomes conductive drawing current based on the value of trimmable resistor 42. This current is drawn through diode-connected transistor 38 which acts as a current mirror to transistor 44. Transistor 44 has a predetermined size ration with transistor 38. Thus, transistor 44 draws current according to the current through transistor 38. Prior to signal WA0 becoming asserted, transistor 75 is coupling VDD2 to the memory cells thus memory cells 46 and 50 are powered at VDD2 prior to signal WA0 being asserted. Also prior to signal WA0 becoming asserted, the output of AND gate 36 is a logic low which causes transistor 45 to be conductive which pre-charges terminal VDWA to VDD1. Upon the assertion of signal WA0, transistor 75 becomes non-conductive, transistor 74 becomes conductive, transistor 45 becomes non-conductive, and transistor 40 becomes conductive. With transistor 40 conductive, transistor 44 begins drawing current from subarray 16 which reduces the voltage at VDWA. Transistor 44 continues to be conductive and reducing the voltage at VDWA until the voltage at VDWA is only a threshold voltage above the gate voltage of transistor 44. When transistor 44 becomes substantially non-conductive, the array power supply voltage stops dropping due to current being pulled through transistor 44. Due to the high capacitance of the power supply node of the array, the voltage is essentially stable for the duration of the write. When the write cycle terminates by either write enable WE or clock being de-asserted, AND gate 36 provides a logic low output which causes transistor 45 to be conductive thereby coupling VDD1 to the source of transistors 74 and 76. Also if it is the write enable signal that becomes de-asserted, signal WA0 becomes a logic low so that transistor 75 becomes conductive which couples VDD2 to bitcell power supply terminal 79. One benefit of transistor 44 becoming non-conductive is ensuring that the subarray voltage stops dropping at a known level. The known level is useful in ensuring that the subarray voltage does not drop so far at to create data retention problems for bitcells on the same column whose word lines are not asserted. Each column has a pair of P channel transistors such as transistors 74 and 75 that are selected to operate as described above when the column is selected. A unique pair of WA and WAB signals is generated for each column. Thus, only the column being written receives the reduced bitcell power supply voltage while the other columns retain the bitcell power supply voltage at VDD2.

The particular voltage to which VDMA is reduced is determined by trimming trimmable resistor 42. This may be done by fuses or by signal values. If signal values are used, they may be stored in non-volatile memory in memory controller 12.

Figure 3:
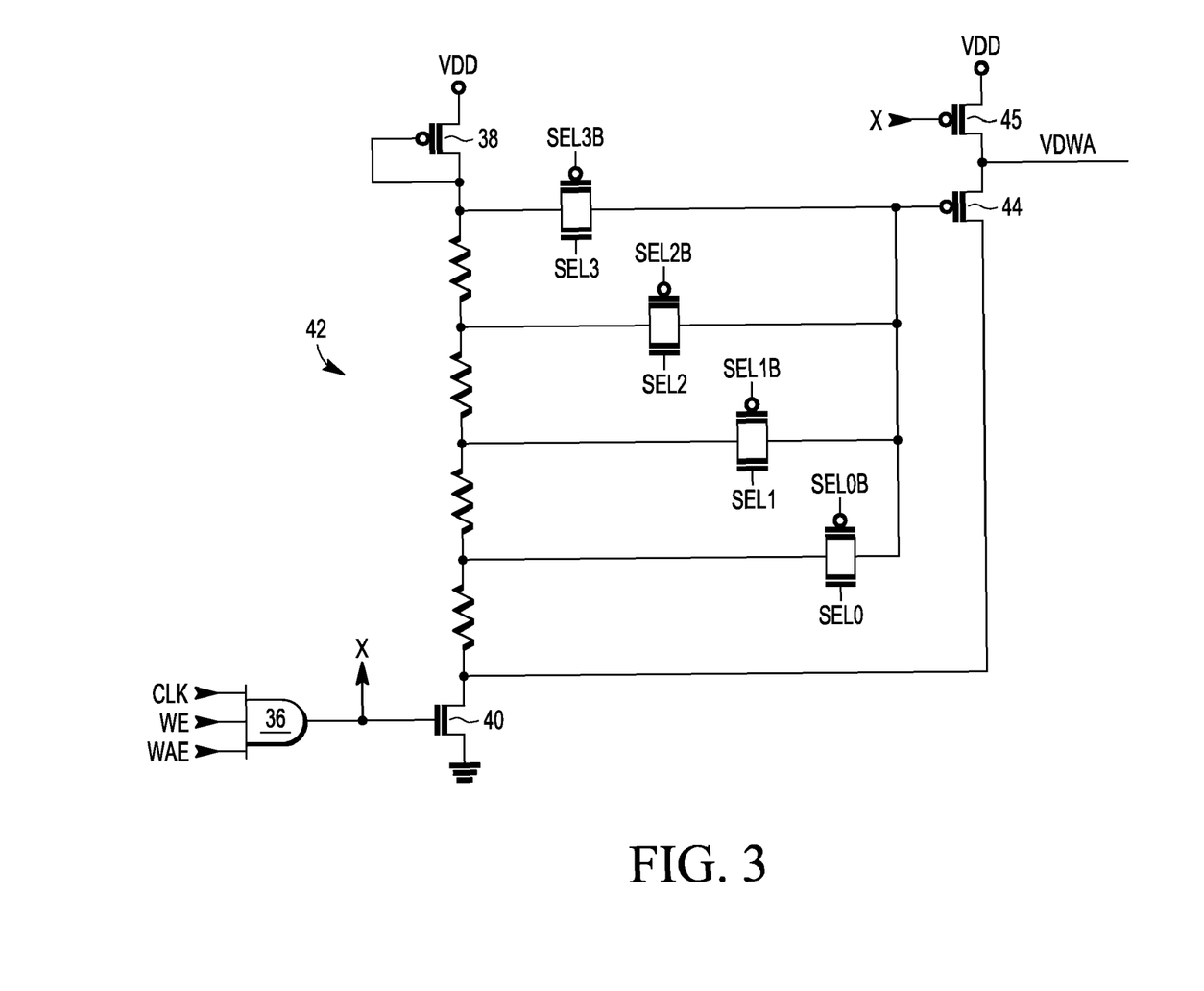
FIG. 3 is a circuit diagram of a portion of the memory block of FIG. 2 according to one alternative.
Figure 4:
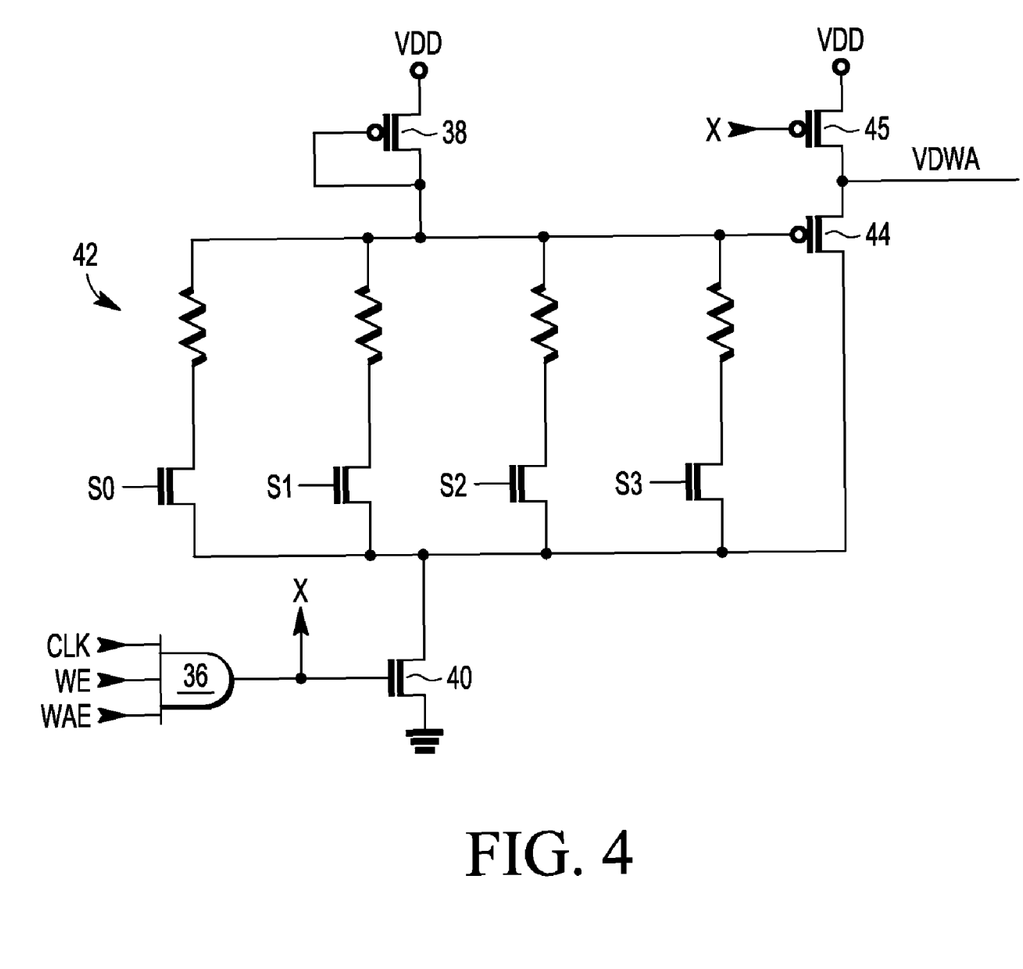
FIG. 4 is a circuit diagram of a portion of the memory block of FIG. 2 according to another alternative.

Shown in FIGS. 3 and 4 are two examples of alternatives for trimmable fuses. Others may also be found to be effective. FIG. 3 shows four resistors in series establishing a voltage divider. A selected one of the nodes is coupled to the gate of transistor. In this case the signals are sel0, sel1, sel2, sel3, and their complements for enabling a transmission gate. The states of these signals may be set by fuses or stored in non-volatile memory. FIG. 4 shows four resistors that may be selectively coupled in parallel to obtain the desired voltage for VDWA. Also the logic state of signals S0, S1, S2, and S3 can be retained by fuses or by storing in non-volatile memory.

By now it should be apparent that a memory has been described. The memory includes a first plurality of memory cells, each of the first plurality of memory cells having a first terminal coupled to a bit line, a second terminal coupled to a word line, and a power supply terminal. The memory further includes a first selection circuit having a first input, a second input coupled to a first power supply voltage terminal, an output coupled to the power supply terminal of each of the first plurality of memory cells, and a control input for receiving a first write assist control signal. The memory further includes a first write assist circuit coupled to the first input of the first selection circuit, the first write assist circuit for reducing a voltage at the power supply terminal of each of the first plurality of memory cells to a first predetermined magnitude during a write operation and in response to an asserted first write assist enable signal. The first write assist circuit includes a first transistor of the first conductivity type having a first current electrode coupled to the first input, a second current electrode selectively coupled to a second power supply voltage terminal, and a control electrode coupled to receive a first variable bias voltage, the first transistor of the first conductivity type for modifying a voltage at the power supply terminal of each memory cell of the plurality of memory cells to the first predetermined magnitude during the write operation. The first write assist circuit further includes a first bias voltage generator coupled to the control electrode of the first transistor of the first conductivity type, the first bias voltage generator for providing the first variable bias voltage in response to the asserted first write assist enable signal. The memory may be further characterized by the first transistor of the first conductivity type comprises a first P-channel transistor. The first bias voltage generator may include a second P-channel transistor having a first current electrode coupled to a third power supply voltage terminal, and a control electrode and a second current electrode both coupled to the control electrode of the first P-channel transistor. The first bias voltage generator may further include a first trimmable resistance having a first terminal coupled to the control electrode of the first P-channel transistor, and a second terminal coupled to the second current electrode of the first P-channel transistor, the first trimmable resistance for setting the first variable bias voltage to provide the first predetermined magnitude. The first bias voltage generator may further include a first N-channel transistor having a first current electrode coupled to the second terminal of the first P-channel transistor, a control electrode, and a second current electrode coupled to the second power supply voltage terminal. The memory may further include a third P-channel transistor having a first current electrode coupled to a fourth power supply voltage terminal, a control electrode coupled to the control electrode of the first N-channel transistor, and a second current electrode coupled to the first input of the first selection circuit. The memory may further include a logic gate having a first input for receiving a clock signal, a second input for receiving a write enable signal, a third input for receiving a write assist enable signal, and an output coupled to the control electrode of the first N-channel transistor. The memory may be further characterized by the first plurality of memory cells being characterized as being a plurality of static random access memory cells. The memory may further comprise a second plurality of memory cells, a second selection circuit, and a second write assist circuit. Each of the second plurality of memory cells may have a first terminal coupled to a bit line, a second terminal coupled to a word line, and a power supply terminal. The second selection circuit may have a first input, a second input coupled to the first power supply voltage terminal, an output coupled to the power supply terminal of each of the second plurality of memory cells, and a control input for receiving a second write assist control signal. The second write assist circuit may be coupled to the first input of the second selection circuit, the second write assist circuit for reducing a voltage at the power supply terminal of each of the second plurality of memory cells to a second predetermined magnitude during a write operation and in response to an asserted second write assist enable signal. The second write assist circuit may further comprise a second P-channel transistor having a first current electrode coupled to the first input of the second selection circuit, a second current electrode selectively coupled to the second power supply voltage terminal, and a control electrode coupled to receive a second variable bias voltage, the second P-channel transistor for reducing a voltage at the power supply terminal of each memory cell of the plurality of memory cells to the second predetermined magnitude during the write operation; and a second bias voltage generator coupled to the control electrode of the second P-channel transistor, the second bias voltage generator for providing the second variable bias voltage in response to the asserted second write assist enable signal. The memory may be further characterized by the second predetermined magnitude being different than the first predetermined magnitude.

Also described is a memory having a first plurality of memory cells, a first selection circuit, and a first write assist circuit. Each of the first plurality of memory cells has a first terminal coupled to a bit line, a second terminal coupled to a word line, and a power supply terminal. The first selection circuit has a first input, a second input coupled to a first power supply voltage terminal, an output coupled to the power supply terminal of each of the first plurality of memory cells, and a control input for receiving a first write assist control signal. The first write assist circuit is coupled to the first input of the first selection circuit, the first write assist circuit for modifying a voltage at the power supply terminal of each of the first plurality of memory cells to a first predetermined magnitude during a write operation and in response to an asserted write assist enable signal. The first write assist circuit includes a first transistor having a first current electrode coupled to the first input, a second current electrode selectively coupled to a second power supply voltage terminal, and a control electrode coupled to receive a bias voltage; and a first resistance having a first terminal coupled to the control electrode of the first transistor, and a second terminal, the first resistance for setting the bias voltage to provide the first predetermined magnitude. The memory may further include a second transistor having a first current electrode coupled to the first power supply voltage terminal, and a control electrode and a second current electrode coupled to the first terminal of the first resistance; and a third transistor having a first current electrode coupled to both the second terminal of the first resistance and the second current electrode of the first transistor, a control electrode, and a second current electrode coupled to a second power supply voltage terminal. The memory may further include a logic gate having a first input for receiving a clock signal, a second input for receiving a write enable signal, a third input for receiving a write assist enable signal, and an output coupled to the control electrode of the third transistor. The memory may further include a fourth transistor having a first current electrode coupled to a third power supply voltage terminal, a control electrode coupled to the control electrode of the third transistor, and a second current electrode coupled to the first input of the first selection circuit. The memory may be further characterized by the first resistance including a plurality of selectable series-connected resistors. The memory may be further characterized by the first resistance including a plurality of selectable parallel-connected resistors. The memory may be further characterized by the first plurality of memory cells being characterized as being a plurality of static random access memory cells. The memory may further include a second plurality of memory cells, a second selection circuit, and a second write assist circuit. Each of the second plurality of memory cells has a first terminal coupled to a bit line, a second terminal coupled to a word line, and a power supply terminal. The second selection circuit has a first input, a second input coupled to a first power supply voltage terminal, an output coupled to the power supply terminal of each of the second plurality of memory cells, and a control input for receiving a second write assist control signal. The second write assist circuit is coupled to the first input of the second selection circuit, the second write assist circuit for reducing a voltage at the power supply terminal of each memory cell of the plurality of memory cells of the second plurality of memory cells to a second predetermined magnitude during a write operation of the second plurality of memory cells and in response to an asserted write assist enable signal. The second write assist circuit includes a second transistor having a first current electrode coupled to the first input, a second current electrode, and a control electrode coupled to receive a bias voltage; and a second resistance having a first terminal coupled to the control electrode, and a second terminal, the second resistance for setting the bias voltage to provide the second predetermined magnitude. The memory may be further characterized by the second predetermined magnitude being different than the first predetermined magnitude.

Described also is a memory having a first memory array, a first selection circuit, a first write assist circuit, a second memory array, a second selection circuit, and a second write assist circuit. The a first memory array includes a plurality of memory cells, each memory cell of the plurality of memory cells having a first terminal coupled to a bit line, a second terminal coupled to a word line, and a power supply terminal. The first selection circuit has a first input, a second input coupled to a first power supply voltage terminal, an output coupled to the power supply terminal of each of the plurality of memory cells, and a control input for receiving a first write assist control signal. The first write assist circuit is coupled to the first input of the first selection circuit. The first write assist circuit includes a first transistor having a first current electrode coupled to the first input of the first selection circuit, a second current electrode, and a control electrode coupled to receive a first bias voltage; and a first trimmable resistance having a first terminal coupled to the control electrode of the first transistor, and a second terminal selectively coupled to a second power supply voltage terminal, the first trimmable resistance for setting the first bias voltage to have a first predetermined magnitude. The second memory array includes a plurality of memory cells, each memory cell having a first terminal coupled to a bit line, a second terminal coupled to a word line, and a power supply terminal. The second selection circuit has a first input, a second input coupled to a third power supply voltage terminal, an output coupled to the power supply terminal of each of the plurality of memory cells of the second memory array, and a control input for receiving a second write assist control signal. The second write assist circuit is coupled to the first input of the second selection circuit. The second write assist circuit includes a second transistor having a first current electrode coupled to the first input of the second selection circuit, a second current electrode, and a control electrode coupled to receive a second bias voltage; and a second trimmable resistance having a first terminal coupled to the control electrode of the second transistor, and a second terminal selectively coupled to a fourth power supply voltage terminal, the second trimmable resistance for setting the second bias voltage to have a second predetermined magnitude, wherein the second predetermined magnitude is different than the first predetermined magnitude. The memory may be further characterized by the first and second memory arrays each including a plurality of static random access memory cells. The first write assist circuit may further include a third transistor having a first current electrode coupled to a fifth power supply voltage terminal, a control electrode and a second current electrode both coupled to the control electrode of the first transistor; a fourth transistor having a first current electrode coupled to the second terminal of the first trimmable resistance, a control electrode, and a second current electrode coupled to the second power supply voltage terminal; and a fifth transistor having a first current electrode coupled to a sixth power supply voltage terminal, a control electrode coupled to the control electrode of the fourth transistor, and a second current electrode coupled to first input of the first selection circuit. The first and third transistors may be P-channel transistors, and the fourth transistor may be an N-channel transistor.

Although the invention has been described with respect to specific conductivity types or polarity of potentials, skilled artisans appreciated that conductivity types and polarities of potentials may be reversed.

Also for example, in one embodiment, the illustrated elements of system 10 are circuitry located on a single integrated circuit or within a same device. Alternatively, system 10 may include any number of separate integrated circuits or separate devices interconnected with each other.

Although the invention is described herein with reference to specific embodiments, various modifications and changes can be made without departing from the scope of the present invention as set forth in the claims below. For example bitcell writeability may be enhanced by raising the bitcell ground voltage in addition to or instead of lowering the bitcell power supply voltage. In such a scenario, the polarity of transistors and supplies used in write assist circuit 22 would change. For example, transistors 38 and 44 would now be N channel transistors that would be coupled to VDD1 instead of a ground terminal during a write operation. Furthermore, such modified write assist circuit would supply current to the subarray during a write operation. Also the operation of write assist circuit 22 may be modified such that it stops drawing current after a predetermined duration from the commencement of write operation. For instance, AND gate 36 may be replaced by alternate logic which uses a self-time delay that serves to limit the duration for which transistor 40 is conducting during a write operation. This may be especially applicable for very slow clock frequencies where there is increased risk of node VDWA dropping below the data retention voltage of the bitcells. The embodiment shown in FIG. 2, indicates a separate bitcell power supply terminal for each column. Further, trimmability of the write assist circuit 22 may be achieved by varying both the size of current mirror transistor 38 and resistor 42. It may be beneficial to have a common bitcell power supply terminal that is shared by multiple columns within a subarray or all columns within the subarray. It also may be beneficial for write assist circuit 22 to be shared by more than one subarray. Furthermore, it may be beneficial for the bias generator formed by transistors 38 and 42 to also be shared across multiple subarrays. Additionally, trimmability of the write assist circuit 22 may be achieved by varying the size of current mirror transistor 38 instead of resistor 42. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
   a first plurality of memory cells, each of the first plurality of memory cells having a first terminal coupled to a bit line, a second terminal coupled to a word line, and a power supply terminal;
   a first selection circuit having a first input, a second input coupled to a first power supply voltage terminal, an output coupled to the power supply terminal of each of the first plurality of memory cells, and a control input for receiving a first write assist control signal; and
   a first write assist circuit coupled to the first input of the first selection circuit, the first write assist circuit for reducing a voltage at the power supply terminal of each of the first plurality of memory cells to a first predetermined magnitude during a write operation and in response to an asserted first write assist enable signal, the first write assist circuit comprising:
      a first transistor of the first conductivity type having a first current electrode coupled to the first input, a second current electrode selectively coupled to a second power supply voltage terminal, and a control electrode coupled to receive a first variable bias voltage, the first transistor of the first conductivity type for modifying a voltage at the power supply terminal of each memory cell of the plurality of memory cells to the first predetermined magnitude during the write operation; and
      a first bias voltage generator coupled to the control electrode of the first transistor of the first conductivity type, the first bias voltage generator for providing the first variable bias voltage in response to the asserted first write assist enable signal.

2. The memory of claim 1, wherein the first transistor of the first conductivity type comprises a first P-channel transistor and wherein the first bias voltage generator comprises:
   a second P-channel transistor having a first current electrode coupled to a third power supply voltage terminal, and a control electrode and a second current electrode both coupled to the control electrode of the first P-channel transistor;
   a first trimmable resistance having a first terminal coupled to the control electrode of the first P-channel transistor, and a second terminal coupled to the second current electrode of the first P-channel transistor, the first trimmable resistance for setting the first variable bias voltage to provide the first predetermined magnitude; and
   a first N-channel transistor having a first current electrode coupled to the second terminal of the first P-channel transistor, a control electrode, and a second current electrode coupled to the second power supply voltage terminal.

3. The memory of claim 2, further comprising a third P-channel transistor having a first current electrode coupled to a fourth power supply voltage terminal, a control electrode coupled to the control electrode of the first N-channel transistor, and a second current electrode coupled to the first input of the first selection circuit.

4. The memory of claim 3, further comprising a logic gate having a first input for receiving a clock signal, a second input for receiving a write enable signal, a third input for receiving a write assist enable signal, and an output coupled to the control electrode of the first N-channel transistor.

5. The memory of claim 1, wherein the first plurality of memory cells is characterized as being a plurality of static random access memory cells.

6. The memory of claim 1, further comprising:
   a second plurality of memory cells, each of the second plurality of memory cells having a first terminal coupled to a bit line, a second terminal coupled to a word line, and a power supply terminal;
   a second selection circuit having a first input, a second input coupled to the first power supply voltage terminal, an output coupled to the power supply terminal of each of the second plurality of memory cells, and a control input for receiving a second write assist control signal; and
   a second write assist circuit coupled to the first input of the second selection circuit, the second write assist circuit for reducing a voltage at the power supply terminal of each of the second plurality of memory cells to a second predetermined magnitude during a write operation and in response to an asserted second write assist enable signal, the second write assist circuit comprising:
      a second P-channel transistor having a first current electrode coupled to the first input of the second selection circuit, a second current electrode selectively coupled to the second power supply voltage terminal, and a control electrode coupled to receive a second variable bias voltage, the second P-channel transistor for reducing a voltage at the power supply terminal of each memory cell of the plurality of memory cells to the second predetermined magnitude during the write operation; and
      a second bias voltage generator coupled to the control electrode of the second P-channel transistor, the second bias voltage generator for providing the second variable bias voltage in response to the asserted second write assist enable signal.

7. The memory of claim 6, wherein the second predetermined magnitude is different than the first predetermined magnitude.

8. A memory comprising:
a first plurality of memory cells, each of the first plurality of memory cells having a first terminal coupled to a bit line, a second terminal coupled to a word line, and a power supply terminal;
a first selection circuit having a first input, a second input coupled to a first power supply voltage terminal, an output coupled to the power supply terminal of each of the first plurality of memory cells, and a control input for receiving a first write assist control signal; and
a first write assist circuit coupled to the first input of the first selection circuit, the first write assist circuit for modifying a voltage at the power supply terminal of each of the first plurality of memory cells to a first predetermined magnitude during a write operation and in response to an asserted write assist enable signal, the first write assist circuit comprising:
   a first transistor having a first current electrode coupled to the first input, a second current electrode selectively coupled to a second power supply voltage terminal, and a control electrode coupled to receive a bias voltage; and
   a first resistance having a first terminal coupled to the control electrode of the first transistor, and a second terminal, the first resistance for setting the bias voltage to provide the first predetermined magnitude.

9. The memory of claim 8, further comprising:
a second transistor having a first current electrode coupled to the first power supply voltage terminal, and a control electrode and a second current electrode coupled to the first terminal of the first resistance; and
a third transistor having a first current electrode coupled to both the second terminal of the first resistance and the second current electrode of the first transistor, a control electrode, and a second current electrode coupled to a second power supply voltage terminal.

10. The memory of claim 9, further comprising a logic gate having a first input for receiving a clock signal, a second input for receiving a write enable signal, a third input for receiving a write assist enable signal, and an output coupled to the control electrode of the third transistor.

11. The memory of claim 10, further comprising a fourth transistor having a first current electrode coupled to a third power supply voltage terminal, a control electrode coupled to the control electrode of the third transistor, and a second current electrode coupled to the first input of the first selection circuit.

12. The memory of claim 8, wherein the first resistance includes a plurality of selectable series-connected resistors.

13. The memory of claim 8, wherein the first resistance includes a plurality of selectable parallel-connected resistors.

14. The memory of claim 8, wherein the first plurality of memory cells is characterized as being a plurality of static random access memory cells.

15. The memory of claim 8, further comprising:
a second plurality of memory cells, each of the second plurality of memory cells having a first terminal coupled to a bit line, a second terminal coupled to a word line, and a power supply terminal;
a second selection circuit having a first input, a second input coupled to a first power supply voltage terminal, an output coupled to the power supply terminal of each of the second plurality of memory cells, and a control input for receiving a second write assist control signal; and
a second write assist circuit coupled to the first input of the second selection circuit, the second write assist circuit for reducing a voltage at the power supply terminal of each memory cell of the plurality of memory cells of the second plurality of memory cells to a second predetermined magnitude during a write operation of the second plurality of memory cells and in response to an asserted write assist enable signal, the second write assist circuit comprising:
   a second transistor having a first current electrode coupled to the first input, a second current electrode, and a control electrode coupled to receive a bias voltage; and
   a second resistance having a first terminal coupled to the control electrode, and a second terminal, the second resistance for setting the bias voltage to provide the second predetermined magnitude.

16. The memory of claim 15, wherein the second predetermined magnitude is different than the first predetermined magnitude.

17. A memory comprising:
a first memory array comprising a plurality of memory cells, each memory cell of the plurality of memory cells having a first terminal coupled to a bit line, a second terminal coupled to a word line, and a power supply terminal;
a first selection circuit having a first input, a second input coupled to a first power supply voltage terminal, an output coupled to the power supply terminal of each of the plurality of memory cells, and a control input for receiving a first write assist control signal;
a first write assist circuit coupled to the first input of the first selection circuit, the first write assist circuit comprising:
   a first transistor having a first current electrode coupled to the first input of the first selection circuit, a second current electrode, and a control electrode coupled to receive a first bias voltage; and
   a first trimmable resistance having a first terminal coupled to the control electrode of the first transistor, and a second terminal selectively coupled to a second power supply voltage terminal, the first trimmable resistance for setting the first bias voltage to have a first predetermined magnitude;
a second memory array comprising a plurality of memory cells, each memory cell having a first terminal coupled to a bit line, a second terminal coupled to a word line, and a power supply terminal;
a second selection circuit having a first input, a second input coupled to a third power supply voltage terminal, an output coupled to the power supply terminal of each of the plurality of memory cells of the second memory array, and a control input for receiving a second write assist control signal; and
a second write assist circuit coupled to the first input of the second selection circuit, the second write assist circuit comprising:
   a second transistor having a first current electrode coupled to the first input of the second selection circuit, a second current electrode, and a control electrode coupled to receive a second bias voltage; and
   a second trimmable resistance having a first terminal coupled to the control electrode of the second transistor, and a second terminal selectively coupled to a fourth power supply voltage terminal, the second trimmable resistance for setting the second bias voltage to have a second predetermined magnitude, wherein the second predetermined magnitude is different than the first predetermined magnitude.

18. The memory of claim 17, wherein the first and second memory arrays each comprises a plurality of static random access memory cells.

19. The memory of claim 17, wherein the first write assist circuit further comprises:
- a third transistor having a first current electrode coupled to a fifth power supply voltage terminal, a control electrode and a second current electrode both coupled to the control electrode of the first transistor;
- a fourth transistor having a first current electrode coupled to the second terminal of the first trimmable resistance, a control electrode, and a second current electrode coupled to the second power supply voltage terminal; and
- a fifth transistor having a first current electrode coupled to a sixth power supply voltage terminal, a control electrode coupled to the control electrode of the fourth transistor, and a second current electrode coupled to first input of the first selection circuit.

20. The memory of claim 19, wherein the first and third transistors are P-channel transistors, and the fourth transistor is an N-channel transistor.

* * * * *